United States Patent
Ouvrier-Buffet et al.

(10) Patent No.: US 6,229,144 B1
(45) Date of Patent: May 8, 2001

(54) BOLOMETRIC HEAT DETECTOR

(75) Inventors: Jean-Louis Ouvrier-Buffet, Sevrier; Jean-Jacques Yon, Sassenage, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/212,404

(22) Filed: Dec. 16, 1998

(30) Foreign Application Priority Data

Dec. 31, 1997 (FR) .................................................... 97 16791

(51) Int. Cl.$^7$ .................................................... H01L 31/09
(52) U.S. Cl. .................................................... 250/338.4
(58) Field of Search ................................ 250/338.4, 332, 250/339.05

(56) References Cited

U.S. PATENT DOCUMENTS

| | | | |
|---|---|---|---|
| 4,679,063 | * 7/1987 | White | 257/187 |
| 5,021,663 | * 6/1991 | Hornbeck | 250/349 |
| 5,288,649 | 2/1994 | Keenan . | |
| 5,369,280 | * 11/1994 | Liddiard | 250/370.08 |
| 5,912,464 | * 6/1999 | Vilain et al. | 250/338.4 |

FOREIGN PATENT DOCUMENTS

| | | |
|---|---|---|
| 0 354 369 | 2/1990 | (EP) . |
| 0 749 007 | 12/1996 | (EP) . |
| 2752299 | 2/1998 | (FR) . |

OTHER PUBLICATIONS

Patent abstracts of Japan, vol. 011, No. 017 (E–471), Jan. 17, 1987, JP 61 187380, Aug. 21, 1986.

* cited by examiner

*Primary Examiner*—Constantine Hannaher
*Assistant Examiner*—Albert Gagliardoi
(74) *Attorney, Agent, or Firm*—Oblon, Spivak, McClelland, Maier & Neustadt, P.C.

(57) ABSTRACT

A bolometric heat detector having an active part composed of at least two coplanar electrodes (8, 10) placed in electrical contact with a first thin semiconducting layer (6), doped by a first doping agent with a first type of conductivity. There is a second thin semiconducting layer (4) doped like the first layer or undoped, and a third thin semiconducting layer (2) doped by a second doping agent with a second type of conductivity opposed to the first. The second layer (4) is placed between the first (6) and the third (2) layers.

16 Claims, 2 Drawing Sheets

BOLOMETRIC HEAT DETECTOR

TECHNICAL DOMAIN AND PRIOR ART

The invention relates to bolometric heat detectors, for example to detect infrared and/or nuclear radiation (X-rays, γ rays, neutrons, etc.)

Infrared detectors usually comprise a sensitive element that can be heated by infrared radiation in band III (8 to 12 μm), characteristic of the temperature and emissivity of observed bodies. The temperature increase in the sensitive element causes a variation in an electrical property of the sensitive material; electrical charges appear by the pyroelectric effects, or a capacitance variation due to a change in the dielectric constant, or a variation in the resistance of a semiconducting or metallic material.

These detectors usually operate at high performance as a result of a low calorific mass of the sensitive material, good thermal insulation between the active layer and its support (these first two conditions require the use of thin layers) and finally high sensitivity of the conversion effect from a temperature rise to an electrical signal (TCR for a resistance).

Monolithic infrared imagers operating at ambient temperature are made by directly connecting a matrix of sensitive elements to a CMOS or CCD type silicon multiplexing circuit.

The thermal detector may be encapsulated under a vacuum or under a gas that is a poor conductor of heat, to improve performance. The housing then includes a window transparent in band III.

In resistive type bolometric detectors, the absorbed incident radiation causes an increase in the temperature of the detector, that in turn induces a variation in the electrical resistance. These variations of the resistance cause variations in the voltage or current at the detector terminals, forming the signal output by the sensor.

Application FR-95 07151 describes a resistive type bolometric structure using a semiconducting material. The sensitive material may be a slightly or strongly resistive p-type or n-type polycrystalline or amorphous silicon. It may also be a vanadium oxide ($V_2O_5$, $VO_2$) generated in a semiconducting phase.

Usually, the sensitive material is placed on an insulating support ($SiO_2$, SiO, SiN, ZnS, etc.) that provides the mechanical stiffness of the bolometric structure. It may also be completely encapsulated with one of these insulating materials.

There are several electrode configurations that can be used to make the value of the resistance compatible with the characteristics of the read circuit. These configurations can be classified in two main categories:

detectors with coplanar electrodes (as in application FR-96 10005), detectors with electrodes facing each other (sandwich).

This invention relates to the first category of detectors.

For this type of device, there is a problem in obtaining a good resistive contact with the doped semiconductor. Doping of the semiconductor reduces its temperature coefficient TCR.

To obtain a resistive contact, so that the current can pass in both directions with a negligible potential drop in the contact region, an attempt is made to:

reduce the height of the barrier as much as possible by a judicious choice of the metal used reduce the thickness of the space charge area (or desertion or depletion) by strongly doping the semiconductor close to the contact.

In order to make bolometric detectors with a high temperature coefficient, the expert in the subject conventionally uses a material that is only slightly doped, in which resistive contacts are obtained by local overdoping achieved using implantation or diffusion techniques. These techniques are firstly relatively expensive to use, and secondly require heat treatments at high temperature incompatible with a bolometric technology assembled on a CMOS or CCD type silicon multiplexing circuit.

One alternative is to use a double slightly doped material/doped material type of layer, the contact regions being defined by etching. However, this technique is very difficult to use due to the lack of selectivity between the two layers, and since their thicknesses are very small.

DESCRIPTION OF THE INVENTION

The purpose of the invention is a bolometric heat detector and a bolometric detection device with a good resistive contact and a good temperature coefficient (TCR).

Another purpose of the invention is to make a imple low cost bolometric type detection structure that guarantees very good resistive contacts and therefore generates very little low frequency noise.

In order to maintain good resistive contact and a good TCR, the invention proposes to depopulate carriers in the inter-electrodes area by using a semiconducting doping layer of the type opposed to that used in the inter-electrodes layer.

Therefore the bolometric heat sensor or detector according to the invention includes an active part composed of at least two coplanar electrodes in electrical contact with a first thin semiconducting layer doped by a first doping agent with a first type of conductivity, a second thin semiconducting layer doped like the first layer, or undoped, in electrical contact with the electrodes, and a third thin semiconducting layer doped by a second doping agent of a second type of conductivity opposed to the first, the second layer being placed between the first and the third layers.

Electrically, the potential difference applied between the electrodes makes a current circulate in the inter-electrodes area defined by the first and second layers (if the second layer is doped), the third layer being at a floating potential.

Therefore, the purpose of the invention is a bolometric heat detector with coplanar electrodes, and insertion of an active layer in this type of detector or bolometer to modify its operation. Its main advantage is that it can be used to obtain materials with a high temperature coefficient, starting from relatively conducting layers, and therefore more easily seable from a technological point of view.

The presence of two opposite types of semiconductors makes the structure of the invention different from traditional structures. In prior art, the bolometric material may be encapsulated between two layers of insulating material such as SiN, $Si_3N_4$ or SiO. However, these layers do not modify the properties of the bolometric material in a controlled manner.

The position of the Fermi level in the semiconducting materials gap is a parameter that controls the conductivity properties of these materials. Thus, the current passing through the structure is limited by the region with the highest resistance, like a depopulated region. The nature of the contacts, or the creation of a region depopulated by an appropriate structure, may modify the initial conductivity of these materials. Thus, the invention proposes to generate regions depopulated of carriers for this purpose, by encapsulating the bolometric material on at least one of its surfaces, with a material that can generate a space charge zone (semiconducting material with the opposite type of conductivity, charged oxide, metallic material).

The invention is intended particularly for use with bolometric detectors made on a read circuit. These bolometers are usually made at low temperature (typically <450° C.). The result is that the materials used are in amorphous, microcrystalline or polycrystalline form and are thin, in order to reduce the heat capacity.

For example, the detector according to the invention may be a detector of infrared type radiation.

BRIEF DESCRIPTION OF THE FIGURES

In any case, the characteristics and advantages of the invention will become more evident after reading the following description. This description concerns example embodiments that are given for explanatory purpose and are in no way restrictive, with reference to the attached drawings in which.

DETAILED DESCRIPTION OF EMBODIMENTS OF THE INVENTION

Figure 1:
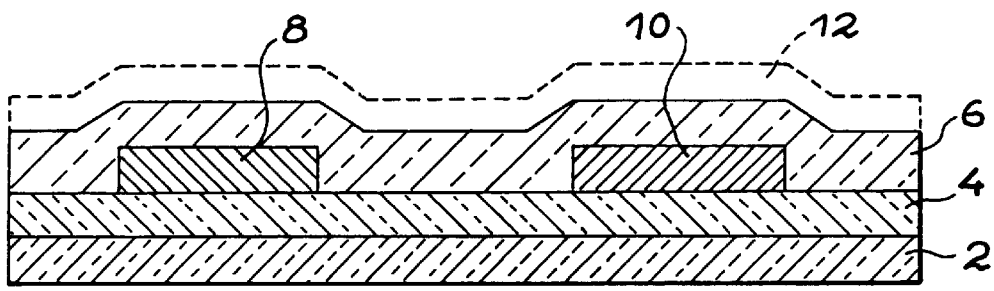
FIG. 1 diagrammaticaly shows the principle of a detector according to the invention.

An example sensor, or bolometer, according to the invention comprises two semiconducting layers 4, 6 with the same type of conductivity (p or n); or a doped semiconducting layer 6 (p or n type) and a layer of intrinsic semiconducting material 4. The assembly encloses metallic electrodes 8, 10 as shown in FIG. 1. This arrangement avoids the formation of a parasite diode that would result in non-linear current-voltage characteristics. Obviously other arrangements are possible.

A layer of semiconducting material 2, with a conductivity opposed to the conductivity of layers 4 and 6 and not connected to a power supply, induces a region depopulated of carriers between electrodes 8, 10, that conducts electricity only slightly and is therefore associated with a high temperature coefficient (at a high activation energy). Furthermore, there is no risk that this additional layer would short circuit the initial layer since, for charge carriers this structure could be interpreted as being a head-tail assembly of two diodes.

There may also be an insulating layer 12 to passivate the device.

This structure behaves like a resistance $R=\rho L/S$, where L is the inter-electrode distance, $\rho$ is the resistivity of the inter-electrodes area and S is its cross-section. The current activation energy is the energy of the majority carriers (holes for a p type material), provided that operation is not close to space charge conditions. In other words, there is a critical value of the electrical field above which the current is limited by this mechanism, which creates a non-uniform distribution of the electrical field and the carrier density. The behavior below this critical field value is resistive, and therefore activated in temperature.

This type of embodiment can relatively simply give metal-p(n) semiconductor-depopulated region-p(n) semiconductor-metal type structures, with the following main properties:

conduction takes place by means of a single type of carrier, metal-p(n) semiconductor type contacts are resistive, the p(n) semiconductor-depopulated region interface is a homojunction, the depopulated region increases the device activation energy.

In a structure according to the invention, the thickness of depopulated regions is firstly greater than the thickness of the layers, and secondly the electrodes composed of metallic material limit the extension of the space charge zone. Thus regions located above the cathode and the anode (in other words above the electrodes) are not depopulated, unlike what happens in the inter-electrodes space.

The extension of the space charge zone is controlled by the doping level of the layers present. A region is completely depopulated if its thickness is less than the extension of the space charge zone. Typically, the thickness of layers of semiconducting and metallic materials used in this invention is between $5.10^{-3}$ ($\mu$m) and 1 $\mu$m. The distance between electrodes is between 0.1 ($\mu$m) and 10 $\mu$m.

Figure 2:
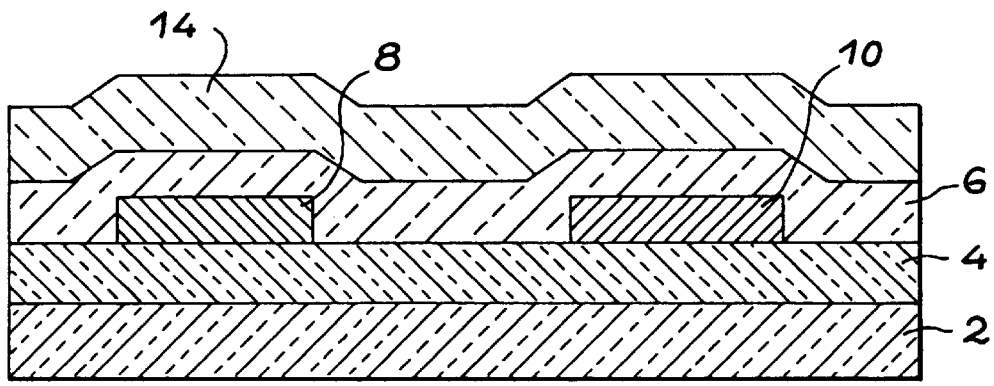
FIGS. 2 and 3 show two variants of a detector according to the invention.

Two variants of the invention may be considered. The first variant (FIG. 2) relates to a singly or doubly depopulated structure with a symmetric thickness (about the reference plan defined by the interface of layers 4 and 6).

The structure described above is covered with an intrinsic semiconducting layer 14, or a layer with the same type of conductivity as layer 2.

This structure passivates the two layers 4, 6 in which carriers circulate; furthermore, the carriers are pushed back to the interface between these two layers. The inter-electrodes region may be completely or partially depopulated depending on the doping level of each of the layer. If the inter-electrodes region is completely depopulated, doping of layers 4, 6 or 2 and 14 may be done asymmetrically in order to guarantee resistive metal-p(n) semiconductor type contacts. For example, doping of layer 6 is greater than doping of layer 4 when doping levels of layers 2 and 14 are identical. Thus the regions above the electrodes are not completely depopulated.

Finally, layers 4 and 14 may be made using a slightly doped or intrinsic material.

Figure 3:
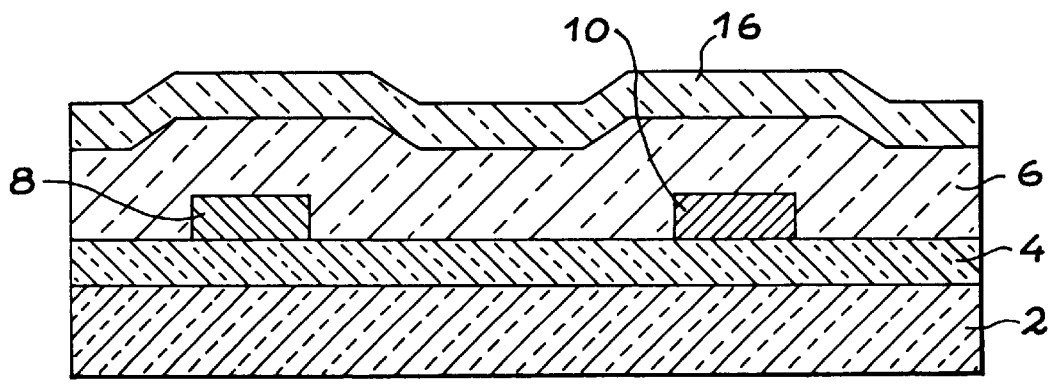

The second variant (FIG. 3) relates to a doubly depopulated active structure with asymmetric thickness.

The structure in FIG. 1 is covered with a semiconducting layer 16 with exactly the same type of conductivity as layer 2.

This configuration has the same advantages as the above, but in this case the resistive contact is provided by modifying the thickness of layers 4, 6. If the depopulated zone generated by layer 2 extends beyond layer 4 such that it joins the space charge zone generated by layer 16, then all that is necessary to make resistive contacts at the electrodes is that the thickness of the space charge zone generated by layer 16 must remain less than the thickness of layer 6. Furthermore, it is possible to insert an undoped intermediate layer between all layers 2 and 4, and all layers 6 and 16.

A heat detector according to the invention comprises one of the sensitive stacks described above, leading to a device with a high temperature coefficient, while overcoming contact problems on a slightly doped material. Furthermore, semiconducting layers not connected to a power supply passivate and shield active layers.

This type of heat detector may be distributed according to a matrix architecture capable of making imagery, in particular infrared (as in FR-96 10005 or FR-95 07151).

Figure 4:
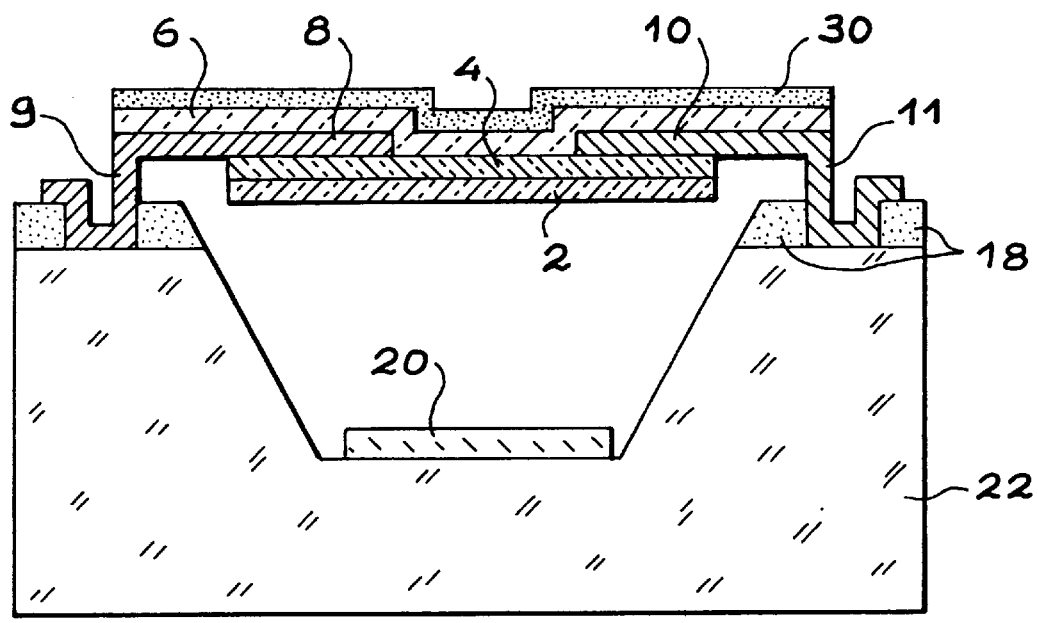
FIGS. 4 and 5 show micro-bridge structures made by etching a substrate or starting from a sacrificial layer.
Figure 5:
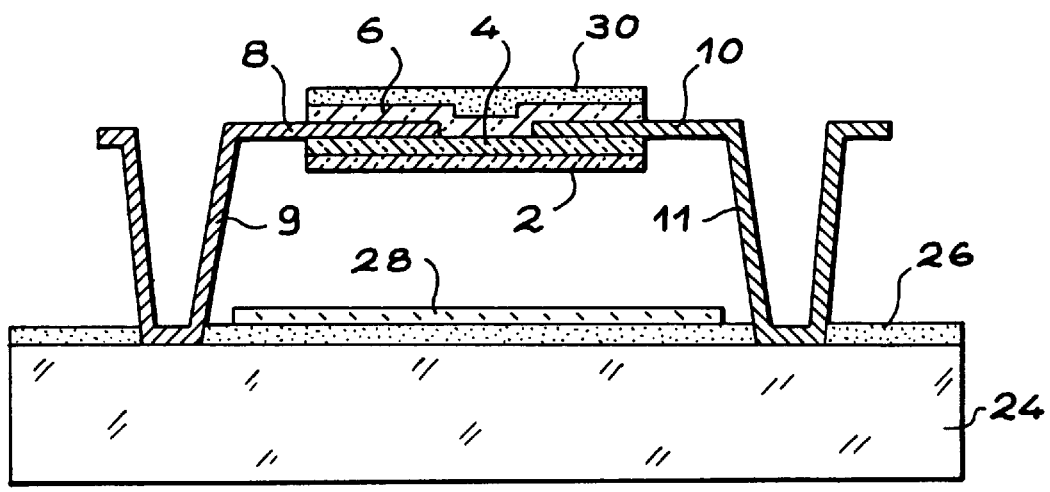

The use of microstructures in thin layers can give efficient thermal insulation of the sensor, or the sensor matrix, from the silicon substrate or the multiplexing circuit. For example, these microstructures may be generated according to different processes used for the manufacture of micro-bridges:

by under-etching the silicon substrate 22 under the sensor, thus partially isolating it from the substrate (or read circuit) 22, as shown in FIG. 4. In this figure, references identical to those in FIGS. 1 or 2 denote identical or corresponding elements; reference 18 denotes a passivation layer and reference 20 denotes a reflecting element located at the bottom of the etched area. Conductors 8 and 10 are extended by support arms 9, 11 at a fixed distance from substrate 22, starting from a sacrificial layer, typically made of polyimide, on which the sensor is formed, and finally etched as illustrated in FIG. 5. In this figure, reference 24 denotes a substrate (or read circuit) covered with a passivation layer 26. A reflecting element 28 is made under the micro-bridge. The conductors 8, 10 are extended by support arms 9, 11 at a fixed distance from the substrate 24.

An absorbent element 30 may possibly be made on the detector.

In the absence of this type of absorber 30 placed at the top of the structure, the electrodes work with reflector 20, 28 (FIGS. 4, 5) to act as radiation absorbent elements (in this case infrared radiation). Thus, in the same way as for the absorber, the resistance per unit area of the layer forming the electrodes 8, 10, and the distance between these electrodes and the reflector 20, 28 are controlled in order to make a quarter wave cavity with maximum absorption at a wave length of about 10 $\mu$m.

Regardless of the embodiment considered, the thin layers (0.005 $\mu$m to 1 $\mu$m) of sensitive elements, made of a semiconducting, amorphous or polycrystalline material (Si, Ge, Si:H, SiGe:H, SiC:H, etc.) may be obtained using low temperature deposition techniques normally used for these materials such as cathodic spraying, thermal decomposition (LPCVD) or plasma (PECVD).

These layers are doped by introducing a doping gas ($B_2H_6$, $PH_3$, etc.) into the reaction vessel or by ionic implantation. The detector structure according to the invention may be obtained by a combination of all these techniques.

Electrodes 8, 10 (Ti, TiN, Pt, Pt—Si, Pd, Ni, NiCr, etc.) located between two layers of semiconducting material are defined by chemical or plasma etching, or by a lift off process. The geometry of these planar electrodes determines the value of the detector resistance.

Finally, these electrodes may be connected to the input stage of a read circuit using conventional processes for making contacts, appropriate for the structure of the micro-bridge in the case shown in FIGS. 4 and 5.

What is claimed is:

1. A bolometric heat detector comprising an active part including:
   at least two coplanar electrodes in electric contact with a first thin semiconducting layer doped by a first doping agent with a first type of conductivity,
   a second thin semiconducting layer doped like the first layer, or undoped, in electrical contact with the electrodes, and
   a third thin semiconducting layer doped by a second doping agent with a second type of conductivity opposed to the first, the second layer being placed between first and the third layers.

2. A detector according to claim 1, further comprising a passivation layer.

3. A detector according to claim 1, having a singly or doubly depopulated structure with symmetric thickness.

4. A detector according to claim 1 or 3, further comprising an intrinsic semiconducting layer, or a layer with the same type of conductivity as the third layer.

5. A detector according to claim 1, with a doubly depopulated structure with asymmetric thickness.

6. A detector according to claim 1 or 5, wherein the first thin semiconducting layer is covered with a semiconducting layer with the same type of conductivity as the third thin layer.

7. A detector according to claim 1, wherein the thickness of each of the semiconducting layers is between 0.005 $\mu$m and 1 $\mu$m.

8. A bolometric type detection device comprising a detector including:
   at least two coplanar electrodes in electric contact with a first thin semiconducting layer doped by a first doping agent with a first type of conductivity,
   a second thin semiconducting layer doped like the first layer, or undoped, in electrical contact with the electrodes, and
   a third thin semiconducting layer doped by a second doping agent with a second type of conductivity opposed to the first, the second layer being placed between first and the third layers;
   wherein the detector is disposed on a substrate or read circuit and thermally insulated therefrom.

9. A device according to claim 8, wherein the detector, and the substrate or the read circuit, have a micro-bridge structure.

10. A device according to claim 9, wherein the substrate or read circuit is etched under the detector.

11. A device according to claim 10, further comprising:
    a reflecting element at the bottom of an etched portion of the substrate, or the read circuit.

12. A device according to claim 9, wherein the detector is separated from the substrate or the read circuit by a space resulting from etching of a sacrificial layer.

13. A device according to claim 12, further comprising:
    a reflecting element disposed between the detector and the substrate.

14. A device according to claim 8, further comprising:
    an absorbent element configured to absorb infrared radiation on the sensor.

15. A device according to claim 8, further comprising:
    a plurality of said detectors distributed according to a matrix architecture.

16. A bolometric heat detector having a set of detectors distributed according to a matrix architecture, each of the detectors comprising an active part including:
    at least two coplanar electrodes in electric contact with a first thin semiconducting layer doped by a first doping agent with a first type of conductivity,
    a second thin semiconducting layer doped like the first layer, or undoped, in electrical contact with the electrodes, and
    a third thin semiconducting layer doped by a second doping agent with a second type of conductivity opposed to the first, the second layer being placed between first and the third layers.

* * * * *